(12) United States Patent
Goutti et al.

(10) Patent No.: US 6,774,726 B2
(45) Date of Patent: Aug. 10, 2004

(54) AMPLIFIER WITH A MOS OUTPUT STAGE

(75) Inventors: Frédéric Goutti, Grenoble (FR);
Vincent Rabary, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/322,205

(22) Filed: Dec. 17, 2002

(65) Prior Publication Data

US 2003/0112077 A1 Jun. 19, 2003

(30) Foreign Application Priority Data

Dec. 17, 2001 (FR) .............................. 01 16305

(51) Int. Cl.[7] .................................. H03F 3/04
(52) U.S. Cl. .................... 330/298; 330/288; 330/207 P
(58) Field of Search .............................. 330/298, 207 P, 330/98, 310, 311, 294, 288; 323/315, 316

(56) References Cited

U.S. PATENT DOCUMENTS

| | | | |
|---|---|---|---|
| 3,534,281 A | 10/1970 | Hillhouse | 330/28 |
| 4,816,963 A * | 3/1989 | Eden | 361/101 |
| 4,926,283 A * | 5/1990 | Qualich | 361/103 |
| 5,877,654 A | 3/1999 | Fong et al. | 330/292 |
| 6,169,456 B1 * | 1/2001 | Pauls | 330/288 |

OTHER PUBLICATIONS van Dongen, "A 1.5 V Class AB CMOS Buffer Amplifier for Driving Low–Resistance Loads," *IEEE Journal of Solid-State Circuits*, 30(12):1333–1337, Dec. 1995.
Ferri, "Low Voltage Design III, " *Electronics World*, pp. 949–955, Nov. 1999.

* cited by examiner

*Primary Examiner*—Henry Choe
(74) *Attorney, Agent, or Firm*—Lisa K. Jorgenson; Dennis M. de Guzman; Seed IP Law Group PLLC

(57) ABSTRACT

An amplifier including first, second, and third series-connected stages, the third stage including a MOS output transistor having its source or drain forming an output terminal of the amplifier, including means for detecting the transition from a first operating state of the output transistor in which the drain current varies little with the voltage between the drain and the source to a second state in which the drain current varies substantially proportionally to the voltage between the drain and the source; and means for, upon detection of such a transition, having the voltage gain of the amplifier and/or the product between the bandwidth of the amplifier and the voltage gain of the amplifier at the upper limit frequency of the bandwidth drop.

13 Claims, 2 Drawing Sheets

AMPLIFIER WITH A MOS OUTPUT STAGE

BACKGROUND OF THE INVENTION

1. Field of the Invention

The present invention relates to amplifiers having at least three stages and the output stage of which is formed by a MOS transistor. The present invention relates, for example, to amplifiers used to amplify audio signals.

2. Description of the Related Art

FIG. 1 shows an example of an architecture of an amplifier including first 11, second 16, and third 18 stages. The first stage 11 has two input terminals 12, 13 across which a differential voltage $V_{DIFF}$ is applied. Output 14 of first stage 11 is applied to an input 15 of second stage 16. Output 17 of second stage 16 is applied to the gate of a MOS output transistor 18 which forms the third stage of amplifier 10. As an example, output MOS transistor 18 is of type P. The source of output transistor 18 is connected to a first voltage source Vdd. The drain of output transistor 18 is connected to a second voltage source, for example, ground GND, via a D.C. bias current source 19. Drain current $I_{D1}$, voltage $V_{DS1}$ between the drain and the source, and voltage $V_{GS1}$ between the gate and the source have also been indicated for output MOS transistor 18.

A first capacitor 22 connects the drain of output transistor 18 to input 15 of second stage 16. A second capacitor 23 connects the drain of output transistor 18 to output 17 of second stage 16.

An output terminal 24 of amplifier 10 corresponds to the drain of output transistor 18.

A load, including for example a resistor 25 coupled in parallel with a capacitor 26, is connected between output terminal 24 and ground GND with an interposed coupling capacitor 27.

FIG. 2 illustrates, in a logarithmic representation, the simplified shapes of curve 30 of gain G and of curve 31 of phase φ of the open-loop response of amplifier 10 of FIG. 1 according to frequency.

As appears on curve 30, gain G exhibits three cut-off frequencies $f_1$, $f_2$, and $f_3$. From the low frequencies to first cut-off frequency $f_1$, the gain is substantially constant and equal to a value $G_0$. Between first $f_1$ and second $f_2$ cut-off frequencies, gain G exhibits an attenuation of approximately –20 dB/decade. Between the second $f_2$ and third $f_3$ cut-off frequencies, gain G exhibits an attenuation of approximately –40 dB/decade. Finally, beyond third cut-off frequency $f_3$, gain G exhibits an attenuation of approximately –60 dB/decade. Cut-off frequencies $f_1$, $f_2$, and $f_3$ are respectively associated with first 11, second 16, and third 18 stages.

Phase φ of amplifier 10 which corresponds to the phase-shift between the signal at output terminal 24 and differential voltage $V_{DIFF}$ is on the order of 180° at low frequencies and decreases by 90° in the vicinity of each cut-off frequency.

Cut-off frequencies $f_2$ and $f_3$ are given by the following expressions:

$$f_2 = g_{m2}^* g_{m3}^* (R_L//r_{ds})/[1 + g_{m3}^*(R_L//r_{ds})]^* 2\pi^* C_2 \quad (1)$$

$$f_3 = g_{m3}/(2\pi^* C_L) \quad (2)$$

where $g_{m2}$ is the transconductance of second stage 16, $g_{m3}$ is the transconductance of third stage 18, $r_{ds}$ is the value of the equivalent resistance of output transistor 18 between the drain and the source, $R_L$ is the value of resistor 25 of the load, $C_2$ is the capacitance of capacitor 23, and $C_L$ is the capacitance of capacitor 26 of the load. Expression $r_{ds}//R_L$ corresponds to the value of the resistance equivalent to resistances $R_L$ and $r_{ds}$ placed in parallel and is equal to $r_{ds}^* R_L/(r_{ds}+R_L)$.

In equation (1), when term $(g_{m3}^*(R_L//r_{ds}))$ is very large as compared to one, the expression of cut-off frequency $f_2$ simplifies and the following expression is obtained:

$$f_2 = g_{m2}/(2\pi^* C_2) \quad (3)$$

A frequency, called the gain-bandwidth product frequency PGB, which corresponds to the frequency at which the gain is equal to one (that is, equal to zero in decibel) is usually defined. The expression of frequency PGB is the following:

$$PGB = g_{m1}^* g_{m2} g_{m3} R_L^* R_{eq}/2\pi^* C_1^* (g_{m2}^* g_{m3}^* R_L^* R_{eq}+1) \quad (4)$$

where $g_{m1}$ is the transconductance of the first stage, $C_1$ is the capacitance of capacitor 22, and $R_{eq}$ is the value of the equivalent resistance seen from the output of second stage 16 of amplifier 10. In the case where term $g_{m2}^* g_{m3}^* R_{eq}^* R_L$ is very large as compared to one, the expression of frequency PGB simplifies, which then provides:

$$PGB = g_{m1}/(2\pi^* C_1) \quad (5)$$

For some values of differential voltage $V_{DIFF}$, amplifier 10 may have a so-called unsteady operation. An unsteadiness of amplifier 10 may translate as the development of parasitic oscillations on the output signal.

A condition to ensure the steadiness of this type of amplifier is that phase φ at frequency PGB, also called the phase margin $M_\phi$, is positive and, usually, greater than 30 degrees. For this purpose, it is desired to obtain cut-off frequencies such that cut-off frequency $f_3$ is greater than cut-off frequency $f_2$, usually, at least twice as large, and that cut-off frequency $f_2$ is greater than frequency PGB, usually at least twice as large. This enables ensuring the obtaining of a positive phase margin $M_\phi$.

FIG. 3 shows curves 35A, 35B representative of current $I_{D1}$ of the drain of output transistor 18 according to the opposite of voltage $V_{DS1}$ for two different values of voltage $V_{GS1}$, noted $V_{GS1}'$ and $V_{GS1}''$. MOS transistor 18 being of type P, the gate-source voltage is negative and $V_{GS1}'$ is smaller than $V_{GS1}''$.

Each curve 35A, 35B includes a first region 36A, 36B, called the linear or ohmic region, in which drain current $I_{D1}$ strongly varies, substantially proportionally to drain-source voltage $V_{DS1}$. The equivalent resistance of the transistor between the drain and the source in the linear region is called $r_{on}$. Resistor $r_{on}$ corresponds to the inverse of the slope of curve 36A, 36B in the linear region. Resistance $r_{on}$ varies according to $V_{GS1}$.

Each curve 35A and 35B includes a second region 37A, 37B, called the saturated region or constant drain current region, in which drain current $I_{D1}$ varies very slightly and substantially proportionally to drain-source voltage $V_{DS1}$. The equivalent resistance between the drain and the source in the saturated region is called $R_0$. Resistance $R_0$ corresponds to the inverse of the slope of curve 35A, 35B in saturated region 37A, 37B. Resistance $R_0$ varies little according to $V_{GS1}$.

Conventionally, resistance $R_0$ is much higher than resistance $r_{on}$. As an example, $r_{on}$ may be on the order of 10 ohms and $R_0$ may be on the order of from some ten to some hundred kiloohms.

In a normal operating mode of amplifier 10, output transistor 18 is in the saturated region. In this case, the value of resistance $r_{ds}$ appearing in the expression of cut-off frequency $f_2$ is equal to resistance $R_0$. Term $g_{m3}*(R_L//r_{ds})$ is then very large as compared to one, and the simplified expression of cut-off frequency $f_2$, given by equation (3), is valid.

However, in some operating modes of amplifier 10, in particular for high values of drain current $I_{D1}$ (which corresponds to negative voltages $V_{GS1}$ of high absolute values), output transistor 18 may switch from the saturated state to the linear state.

To illustrate this phenomenon, a load line 39 for a given load resistance has been shown in FIG. 3. The operating point of the circuit formed by the amplifier and the load corresponds to an interception between curve 39 and the curve representative of drain current $I_{D1}$ according to drain-source voltage $V_{DS1}$.

It can also be noted that, when the gate-source voltage is equal to $V_{GS1}'$, operating point 40B is located in saturated portion 37B of curve 35B. In this case, resistance $r_{ds}$ is equal to $R_0$ and the simplified expression, given by equation (2), of cut-off frequency $f_2$ is valid.

When gate-source voltage $V_{GS1}$ is equal to voltage $V_{GS1}'$, operating point 40A of the circuit is located in linear portion 36A of curve 35A. In this case, resistance $r_{ds}$ is equal to $r_{on}$, which is much smaller than $R_0$. In this case, term $g_{m3}*(R_L//r_{ds})$ can no longer be much greater than one, and the value of cut-off frequency $f_2$ associated with second stage 16 decreases.

However, the value of frequency PGB remains substantially constant. As a result, the value of cut-off frequency $f_2$ comes closer to the value of frequency PGB. The condition of steadiness of amplifier 10, which prescribes maintaining cut-off frequency $f_2$ greater than twice frequency PGB, can no longer be fulfilled. An unsteadiness of the amplifier may then occur.

BRIEF SUMMARY OF THE INVENTION

An embodiment of the present invention aims at obtaining an amplifying circuit having its output stage formed by a MOS transistor and in which any unsteady operation of the amplifier is prevented.

For this purpose, an amplifier is provided including first, second, and third series-connected stages, the third stage including a MOS output transistor having its source or drain forming an output terminal of the amplifier, the amplifier further including a first capacitance between the output terminal and the input of the second stage, and a second capacitance between the output terminal and the output of the second stage, and further including means for detecting the transition from a first operating state of the output transistor in which the drain current varies little with the voltage between the drain and the source to a second state in which the drain current varies substantially proportionally to the voltage between the drain and the source; and means for, upon detection of such a transition, having the voltage gain of the amplifier and/or the product between the bandwidth of the amplifier and the voltage gain of the amplifier at the upper limit frequency of the bandwidth drop.

According to an embodiment of the present invention, the means for detecting the transition from the first operating state of the output transistor to the second operating state, and the means for having the voltage gain of the amplifier and/or the product between the bandwidth of the amplifier and the voltage gain of the amplifier at the upper limit frequency of the bandwidth drop comprises an additional MOS transistor.

According to an embodiment of the present invention, the additional MOS transistor is connected as a diode between the gate of the output transistor and the output terminal.

According to an embodiment of the present invention, the additional MOS transistor and the output transistor have a channel of the same polarity type.

An embodiment of the present invention also provides a method for protecting an amplifier including first, second, and third series-connected stages, the third stage including a MOS output transistor, having its source or its drain forming an output terminal of the amplifier, the amplifier further including a first capacitor between the output terminal and the input of the second stage, and a second capacitor between the output terminal and the output of the second stage, including the steps of detecting the transition from a first operating state of the output transistor in which the drain current varies little with the voltage between the drain and the source to a second state in which the drain current varies substantially proportionally to the voltage between the drain and the source; and having, upon detection of such a transition, the voltage gain of the amplifier and/or the product between the bandwidth of the amplifier and the voltage gain of the amplifier at the upper limit frequency of the bandwidth drop.

According to an embodiment of the present invention, the transition from the first operating state of the output transistor to the second operating state switches an additional MOS transistor from an off state to an on state to have the equivalent resistance of the amplifier as seen from the output of the second stage drop.

The foregoing features of the present invention, will be discussed in detail in the following non-limiting description of specific embodiments in connection with the accompanying drawings.

DETAILED DESCRIPTION OF THE INVENTION

Embodiments of an amplifier with a MOS output stage are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
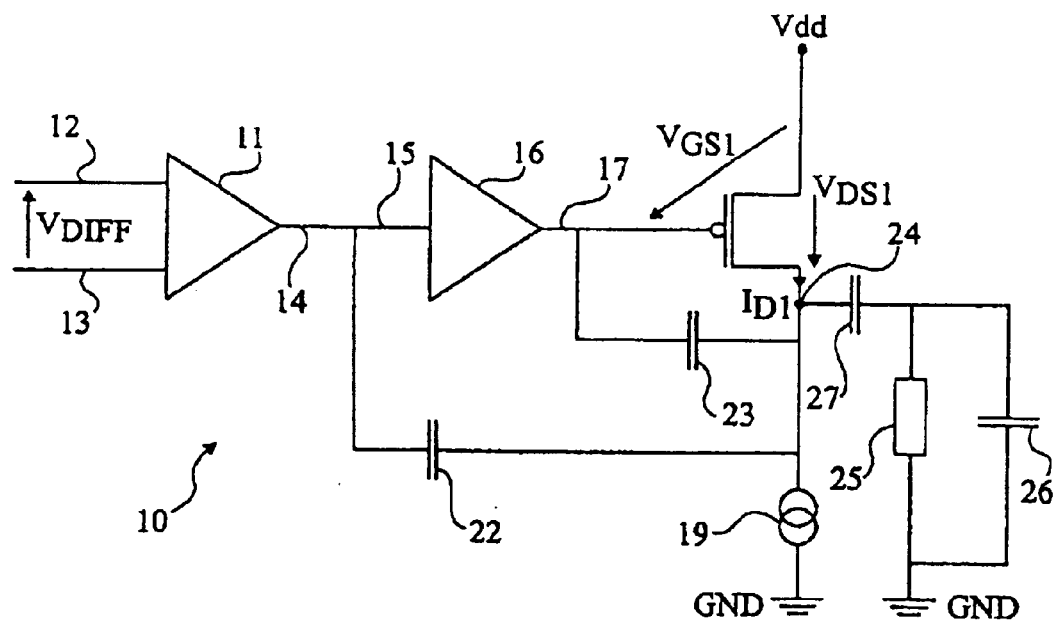
FIG. 1, previously described, shows a conventional architecture of a three-stage amplifier having its output stage formed by a MOS transistor.
Figure 2:
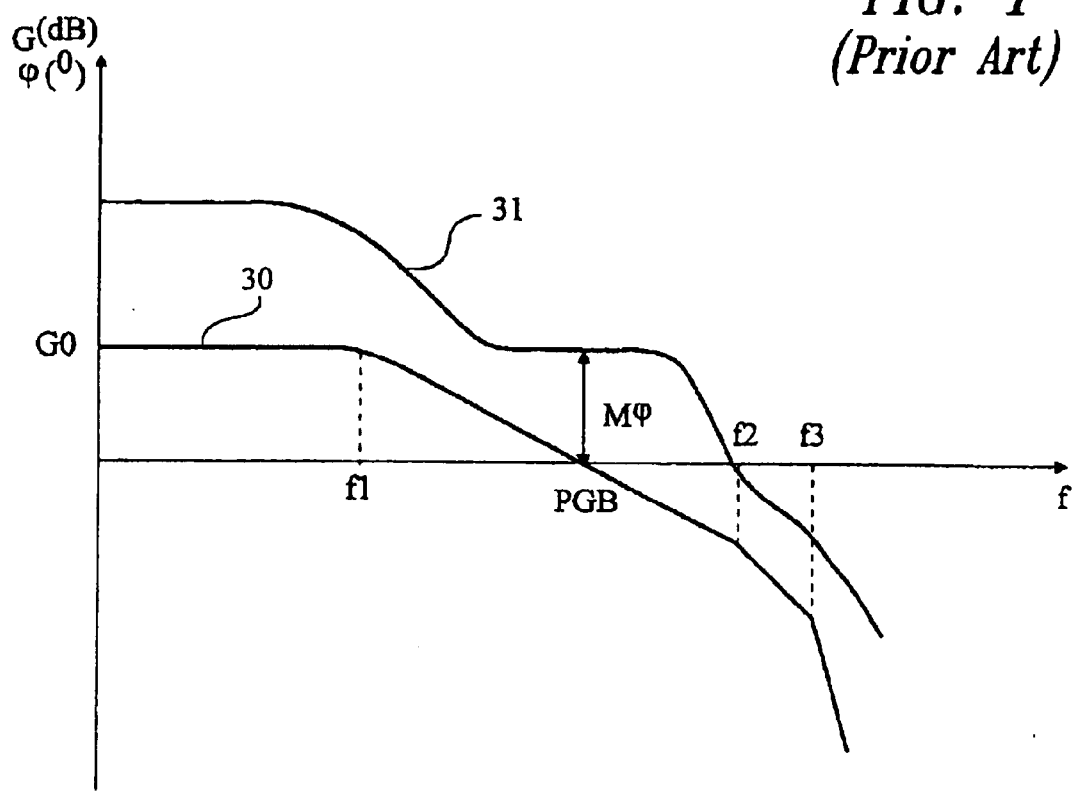
FIG. 2, previously described, schematically shows the gain and the phase of the amplifier of FIG. 1 according to frequency.
Figure 3:
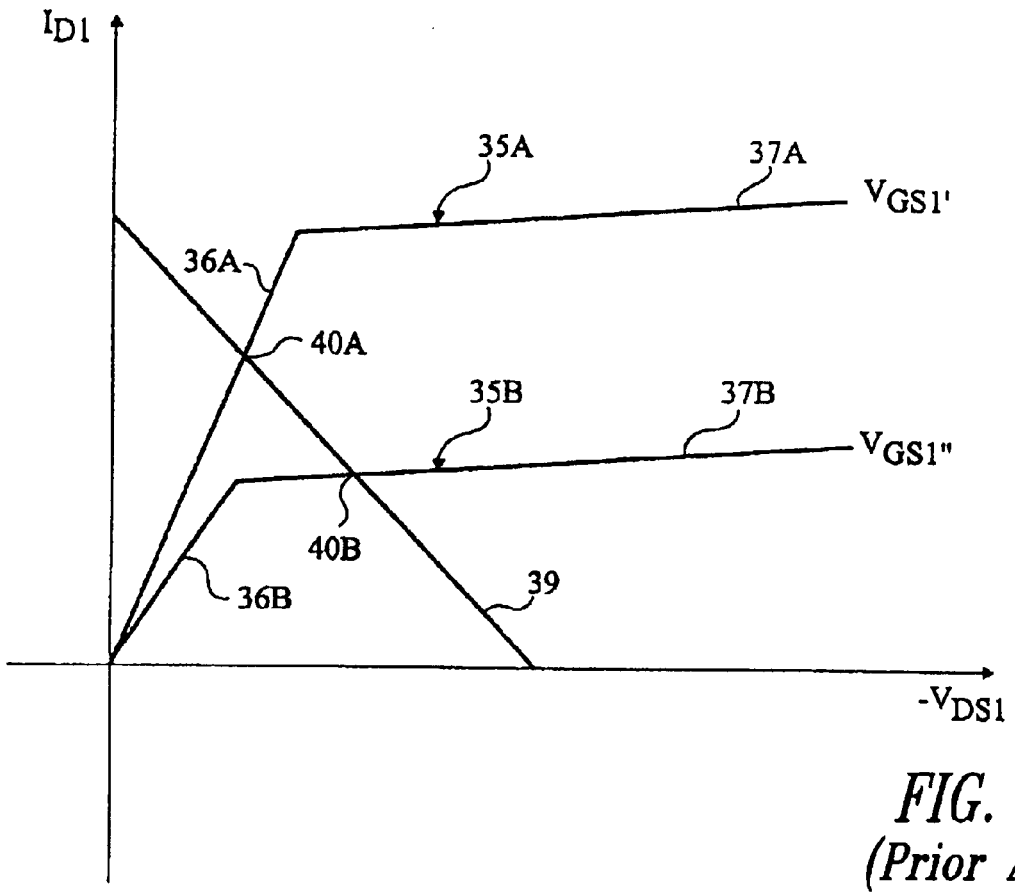
FIG. 3, previously described, shows two curves representative of the drain current according to the drain-source voltage of the output transistor of the amplifier.

According to an embodiment of the present invention, a MOS-type P-channel protection transistor 43 connected as a diode is added to the circuit of FIG. 1. The source of protection transistor 43 is connected to the drain of output transistor 18, the drain of protection transistor 43 is connected to the gate of output transistor 18, and the gate of protection transistor 43 is connected to the gate of output transistor 18. Gate-source voltage $V_{GS1}$ and drain-source voltage $V_{DS1}$ and drain current $I_{D1}$ of output transistor 18, as well as gate source voltage $V_{GS2}$ and drain source voltage $V_{DS2}$ and drain current $I_{D2}$ of protection transistor 43 have been indicated on FIG. 4.

Protection transistor 43 enables detection of the transition from a saturated operating mode to a linear operating mode of output transistor 18.

Indeed, the condition of linear operation of P-channel output transistor 18 is expressed as follows:

$$V_{GS1} - V_T < V_{DS1} \quad (6)$$

where $V_T$ represents the threshold voltage of output transistor 18. The (negative) threshold voltage $V_T$ is defined as follows: when (negative) voltage $V_{GS1}$ between the gate and the source is smaller than $V_T$, the running of a drain current $I_{D1}$ is possible (the transistor is then said to be on), and when voltage $V_{GS1}$ is greater than $V_T$, drain current $I_{D1}$ is substantially zero whatever voltage $V_{DS1}$ (the transistor is then said to be off).

Figure 4:
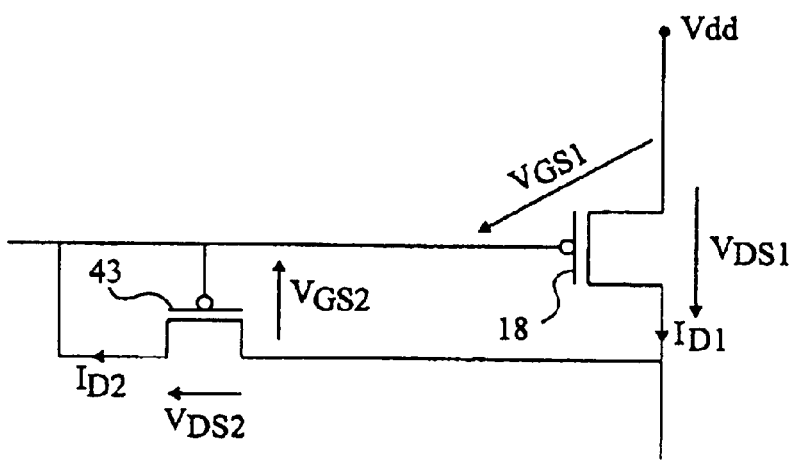
FIG. 4 shows an example of embodiment of a portion of the circuit of FIG. 1 according to the present invention.

FIG. 4 also provides the following relation:

$$V_{GS1} - V_{GS2} - V_{DS1} = 0 \quad (7)$$

Introducing the expression of $V_{GS1}$ in equation (6) provides:

$$V_{GS2} - V_T < 0 \quad (8)$$

If both transistors 18, 43 are of the same type, they have a threshold voltage $V_T$ of the same order. Equation (8) thus means that protection transistor 43 turns on. Protection transistor 43, connected as a diode, then operates in saturated mode.

Similarly, it could be shown that, when output transistor 18 operates in saturated mode, protection transistor 43 is off.

Thus, when output transistor 18 is in a normal operating mode for amplifier 10, that is, in saturated mode, protection transistor 43 is off and does not influence the operation of amplifier 10.

Conversely, when output transistor 18 switches from a saturated operating mode to a linear operating mode, poorly adapted for the operation of amplifier 10, protection transistor 43 turns on.

When protection transistor 43 switches from an off state to an on state, frequency PGB is modified. Indeed, the value of equivalent resistor $R_{eq}$ seen from output 17 of second stage 16 is modified. Calling $R_{eq1}$ the value of the resistance seen from the output of second stage 16 when protection transistor 43 is off, the value of the resistance seen from output 17 of second stage 16 when protection transistor 43 is on corresponds to the putting in parallel of $R_{eq1}$ with a resistance $R_t$ which substantially corresponds to the inverse of the gate-source transconductance of protection transistor 43. Resistance $R_t$ is very small (generally smaller than some hundred ohms). Resistance $R_{eq}$ seen from the output of second stage 16 thus drops, causing the drop of frequency PGB. The decrease in frequency PGB follows that of frequency $f_2$ (the origin of which is the linear operation of output transistor 18). It is thus possible to prevent the transition of the amplifier to an operation mode for which cut-off frequency $f_2$ would not be twice as large as the value of frequency PGB, and thus prevent any unsteadiness of amplifier 10.

The switching on of protection transistor 43 also causes the drop of gain G of amplifier 10. Indeed, low-frequency gain $G_0$ of amplifier 10 generally corresponds to the product of the transconductances of the three stages 11, 16, 18, and of the equivalent resistances as seen from the output of first stage 11, of second stage 16, and of third stage 18.

The drop in resistance $R_{eq}$ as seen from output 17 of second stage 16, when protection transistor 43 turns on, thus causes the drop of low-frequency gain $G_0$ of amplifier 10, and accordingly the gain drop of amplifier 10. Amplifier 10 thus no longer amplifies the signal at its input.

An embodiment of the present invention is excessively simple to implement and is particularly effective since it causes the parallel drop of frequency PGB, which enables maintaining the amplifier steadiness, as well as the drop of the amplifier gain interrupting the amplifier operation.

Further, one embodiment of the present invention, implementing a single additional MOS transistor of the same type as the output transistor, is of particularly low cost in terms of silicon surface area in the case of an integration of the different components forming the amplifier.

Of course, the present invention is likely to have various alterations, modifications, and improvements which will readily occur to those skilled in the art. In particular, the drain of the protection transistor may be connected to another circuit point rather than to the gate of the output transistor, the voltage of this point being adapted to cause the same drop of frequency PGB and of gain G. Further, the output transistor and the protection transistor may be formed by N-channel MOS transistors. Further, the bias current source may be replaced with an N-channel MOS transistor, which can then be associated to an N-channel MOS transistor, according to an assembly corresponding to that of FIG. 4.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. An amplifier including first, second, and third series-connected stages, the third stage including a MOS output transistor having its source or drain forming an output terminal of the amplifier, the amplifier further including a first capacitance between the output terminal and the input of the second stage, and a second capacitance between the output terminal and the output of the second stage, the amplifier including:

means for detecting the transition from a first operating state of the output transistor, in which the drain current varies little with the voltage between the drain and the source, to a second state, in which the drain current varies substantially proportionally to the voltage between the drain and the source; and means for, upon detection of such a transition, having the voltage gain of the amplifier and/or the product between the bandwidth of the amplifier and the voltage gain of the amplifier at the upper limit frequency of the bandwidth drop.

2. The amplifier of claim 1 wherein said means for detecting the transition from the first operating state of the output transistor to the second operating state, and the means for having the voltage gain of the amplifier and/or the product between the bandwidth of the amplifier and the voltage gain of the amplifier at the upper limit frequency of the bandwidth drop comprises an additional MOS transistor.

3. The amplifier of claim 2 wherein the additional MOS transistor is connected as a diode between the gate of the output transistor and the output terminal.

4. The amplifier of claim 2 wherein the additional MOS transistor and the output transistor have a channel of the same polarity type.

5. A method for protecting an amplifier including first, second, and third series-connected stages, the third stage including a MOS output transistor, having its source or its drain forming an output terminal of the amplifier, the amplifier further including a first capacitance between the output terminal and the input of the second stage, and a second capacitance between the output terminal and the output of the second stage, the method including the steps of:

detecting the transition from a first operating state of the output transistor in which the drain current varies little with the voltage between the drain and the source to a second state in which the drain current varies substantially proportionally to the voltage between the drain and the source; and having, upon detection of such a transition, the voltage gain of the amplifier and/or the product between the bandwidth of the amplifier and the voltage gain of the amplifier at the upper limit frequency of the bandwidth drop.

6. The method of claim 5 wherein the transition from the first operating state of the output transistor to the second operating state switches an additional MOS transistor from an off state to an on state to have the equivalent resistance of the amplifier as seen from the output of the second stage drop.

7. An apparatus comprising:

an amplifier having an output transistor; and a circuit element coupled to the output transistor, wherein the amplifier includes:
first, second, and third stages, the third stage including the output transistor and an output terminal;
a first capacitor coupled between the output terminal and an input terminal of the second stage; and
a second capacitor coupled between the output terminal and an output terminal of the second stage, wherein if the output transistor is in a first operating mode, the amplifier is coupled to operate independently of the circuit element, and wherein if the output transistor transitions from the first operating mode to a second operating mode, the circuit element is coupled to keep a cut-off frequency of the amplifier greater than a gain-bandwidth product (PGP) frequency of the amplifier.

8. The apparatus of claim 7 wherein in response to the transition from the first operating mode to the second operating mode, a decrease of the PGP frequency follows a decrease in the cut-off frequency.

9. The apparatus of claim 7 wherein the circuit element comprises a MOS transistor.

10. The apparatus of claim 9 wherein the MOS transistor has first and second terminals coupled to a first terminal of the output transistor, and has a third terminal coupled to a second terminal of the output transistor.

11. The apparatus of claim 9 wherein the MOS transistor is diode-connected to the output transistor.

12. The apparatus of claim 9 wherein the MOS transistor and the output transistor have a same conductivity type.

13. The apparatus of claim 7 wherein the first operating mode comprises a saturated operating mode, and wherein the second operating mode comprises a linear operating mode.

* * * * *